United States Patent [19]

Aizaki

[11] Patent Number: 4,894,803

[45] Date of Patent: Jan. 16, 1990

[54] MEMORY CIRCUIT WITH IMPROVED DATA OUTPUT CONTROL

[75] Inventor: Shingo Aizaki, Tokyo, Japan

[73] Assignee: NEC Corporation, Tokyo, Japan

[21] Appl. No.: 161,806

[22] Filed: Feb. 29, 1988

[30] Foreign Application Priority Data

Feb. 27, 1987 [JP] Japan ................................. 62-45730

[51] Int. Cl.[4] ........................ G11C 7/00; G11C 11/40
[52] U.S. Cl. ........................... 365/189.05; 365/189.11; 365/233.5; 365/203
[58] Field of Search ............... 365/189, 230, 203, 233, 365/189.11, 189.05, 233.5; 307/234

[56] References Cited

U.S. PATENT DOCUMENTS

| | | | |
|---|---|---|---|
| 4,573,147 | 2/1986 | Aoyama et al. | 365/230 |
| 4,592,026 | 5/1986 | Matsukawa et al. | 365/230 X |
| 4,701,889 | 10/1987 | Ando | 365/203 X |
| 4,744,063 | 5/1988 | Ohtani et al. | 365/227 X |

Primary Examiner—Stuart N. Hecker
Assistant Examiner—Alyssa H. Bowler
Attorney, Agent, or Firm—Sughrue, Mion, Zinn, Macpeak & Seas

[57] ABSTRACT

A memory circuit having an improved address change detect circuit which, upon a change of address, forms a first internal one-shot signal for resetting the memory circuit and a second internal one-shot signal for enabling the memory circuit is disclosed. The memory circuit further has a function which, after the read-out data is held by the latch circuit, stops the addressing operation in synchronism with the termination of the second internal one-shot signal, wherein the period for transmitting the sense amplifier output to the latch circuit is determined by a period for generating the second internal one-shot signal and, when the first internal one-shot signal is generated, the transmission is preferentially inhibited irrespective of the second internal one-shot signal.

7 Claims, 4 Drawing Sheets

MEMORY CIRCUIT WITH IMPROVED DATA OUTPUT CONTROL

BACKGROUND OF THE INVENTION

The present invention relates to a memory circuit and more particularly to a static type ciruit provided with an internal control signal generator for generating timing signals when at least one input signal changes in level.

As static type memory circuits, so-called internally synchronous type memory have been majorly employed because they consume less amount of power consumption. The internally synchronous type memory has a timing signal generater which generates a series of timing signals for controlling the respective functional circuits in the memory upon each change in at least one input signal such as address input signals.

In order to further reducing the power consumption and increasing the memory capacity, there has been proposed a so-called pulse-word architecture in which after data stored in a selected memory cell is read and amplified by a sense amplifier and the amplified data by the sense amplifier is held by a latch circuit for producing a read-out signal, a word line decoder and the sense amplifier are reset. Thus, the power consumption caused by the word line decoder and the sense amplifier is avoided while the read-out signal is generated by the latch circuit.

The pulse word architecture suppresses undesired charge and discharge currents in bit lines and in data bus lines as well as DC current of the sense amplifier, and is effective for decreasing the consumption of electric power.

In order to realize the pulse word architecture, it is an indispensable requirement to provide the memory circuit with an internal control signal generator which detects a change in address to generate internal timing signals.

The above-mentioned conventional memory circuit has defects as described below.

One of the nuisances involved in the memory circuit is a change in the power source voltage Vcc and in the ground potential GND accompanying a change in the operation current in the memory circuit. Particularly, the output transistor usually charges and discharges a capacity of from several tens to several hundreds of picofarads, and is generally designed to exhibit a large transistor ability. Therefore, the switching current of the output transistor at the time of reading operation causes the power source voltage Vcc and ground potential GND to change most greatly among other circuit operations.

The input stage of an address buffer may sense a change in the power supply voltage Vcc and in the ground potential GND caused by this change as the change in the input potential itself applied thereto, whereby the address buffer starts to operate. That is, the potential change is added to the input voltage of the address buffer, and the input level loses its actual, absolute level which is detrimental to the characteristics. Moreover, a great change in the potential makes it difficult to satisfy the specifications of the input level.

SUMMARY OF THE INVENTION

It is an object of the present invention to provide a memory circuit of the pulse-word architecture which can operate at a high speed and with power consumption of a reduced amount.

It is another object to provide a memory circuit which can operate stably without being influenced by the change in power supply voltages.

The memory circuit according to the present invention comprises a memory cell array, a sense amplifier, a latch circuit for operatively holding the output of the sense amplifier and a control signal generator for generating when it least one address input signal is changed, a first control signal for precharging the memory cell array and a second control signal for enabling the sense amplifier and is featured by a transferring circuit for transferring the output of the sense amplifier to the latch circuit only when the second control signal is present and the first control signal is not present.

According to the above feature, even when the control signal generator erroneously generates the first control signal to precharge the memory cell array, such state in the memory cell array is not transmitted to the latch circuit. Therefore, multifunction of the latch circuit can be prevented.

DETAILED DESCRIPTION OF THE INVENTION

Figure 1:
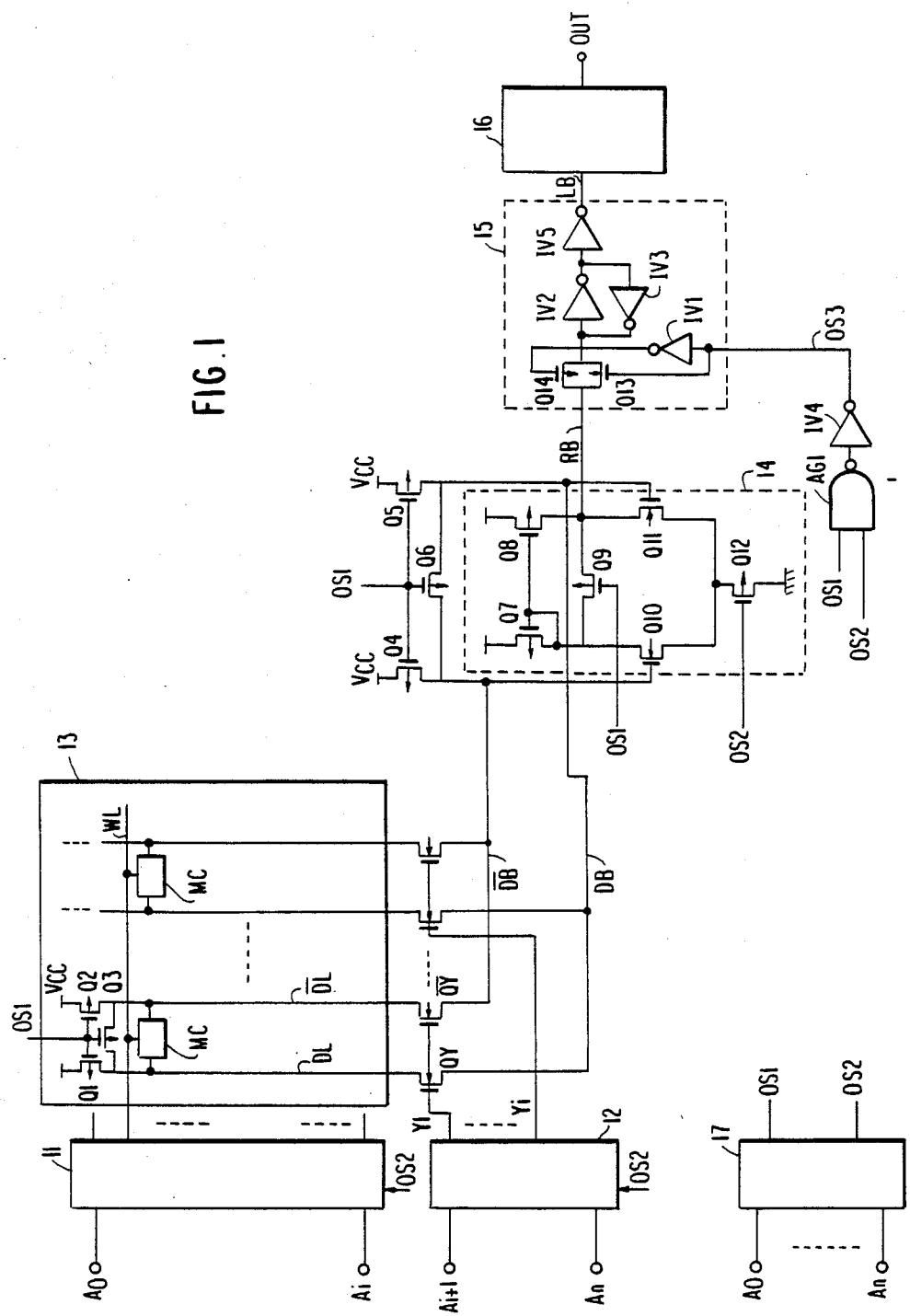
FIG. 1 is a schematic block diagram showing a major part of the memory circuit according to a first embodiment of the present invention.

Referring to FIG. 1, the memory circuit according to a first embodiment comprises a memory cell array 13 having a plurality of atatic type memory cells MC, a plurality of pairs of bit lines DL, $\overline{DL}$ and a plurality of word lines WL. Each pair of bit lines DL and $\overline{DL}$ are provided with P-channel precharge transistors $Q_1$ to $Q_3$ controlled by a first timing signal OS1 for resetting. A word decoder 11 receives row address signals $A_0$–$A_i$ to select one of the word lines WL. A column decoder 12 receives column address signals $A_{i+1}$–$A_n$ to render a selected pair of column selection gates QY, $\overline{QY}$ conductive so that the selected pair of bit lines are electrically connected to a pair of data bus lines DB, $\overline{DB}$. The pair of bus lines DB, $\overline{DB}$ are connected to a pair of input nodes of a differential type sense amplifier 14 which is reset by the first timing signal OS1 and enabled by a second timing signal OS2. The data bus lines are provided with P-channel transistors $Q_4$–$Q_6$. An output node of the sense amplifier 14 is connected to an input node of a latch circuit 15 via a read data line RB. The latch circuit 15 takes the state of RB thereinto in response to a third timing signal OS3. The output of the latch circuit 15 is fed to an input node of an output circuit 16 via a line LB. A timing signal generator 17 receives each of address signals $A_0$–$A_n$ and generates the low-going pulse of the first timing signal OS1 whenever at least one of the address input signals $A_0$–$A_n$ is changed in level and further generates the positive-going pulse of the second timing signal OS2 after the generation of OS1.

Figure 3:
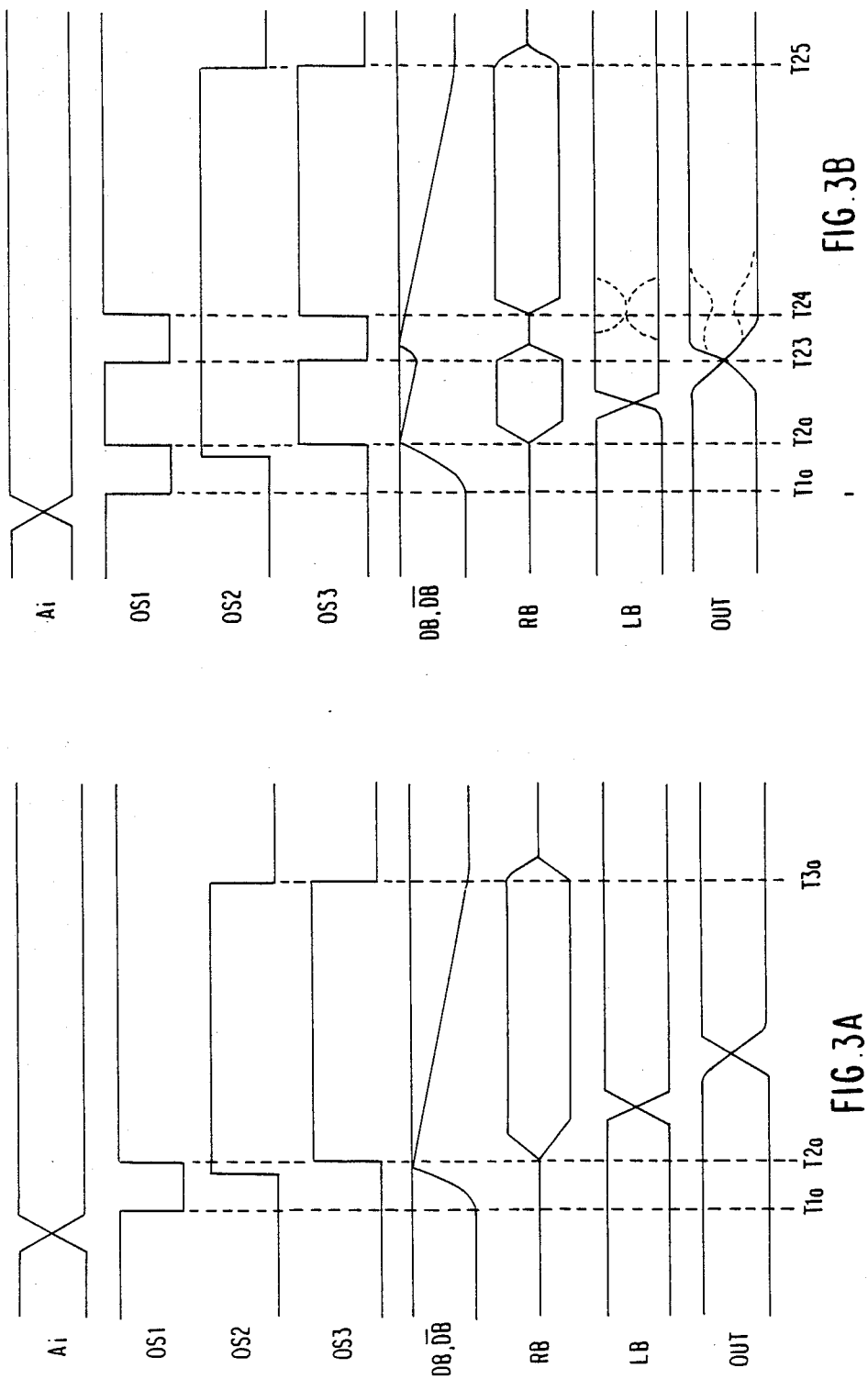
FIGS. 3A and 3B are timing waveforms showing operation of the memory circuit of FIG. 1.

As is conventional, the signal OS1 is used as a control signal for precharging and equalizing the bit lines and the data bus lines DB, $\overline{DB}$ before the reading operation is started. The signal OS1 is a one-shot signal having a narrower pulse width to obtain a higher operation speed, as shown in FIG. 3A. The signal OS2, on the other hand, is used for determining a period for selecting the word line and for determining a period for activating the sense amplifier 14. Therefore, the signal OS2 has a width longer than a period in which the read-out data is transmitted to the latch circuit 15, as shown in FIG. 3A.

A normal read-out operation of the circuit of FIG. 1 in the case when the pulse-word system is employed will now be described with reference to FIG. 3A.

A change in the address signal (one of $A_0-A_n$) gives rise to the generation of the signals OS1 and OS2. As the signal OS1 assumes the "L" level at the mount $T_{1a}$, the P-channel MOS transistors $Q_4$ to $Q_6$ are rendered conductive to precharge the data bus lines DB and $\overline{DB}$ to the Vcc level.

As the signal OS1 assumes the "H" level at a moment $T_{2a}$, precharging operation for the data bus lines DB and $\overline{DB}$ is terminated and whereby a potential difference develops in the data held by the selected memory cell, i.e., a potential difference develops between the data but lines DB and $\overline{DB}$. At this moment, since the signal OS2 is assuming the "H" level, the sense amplifier SA is in an active condition. Therefore, the data of the selected cell amplified by the sense amplifier 14 appears on the output line RB.

At that time, the latch circuit 15 is enabled by the signal OS3, which will be described later in detail, and the data on the line RB is transferred to the latch circuit 15 and latched therein. The latch circuit output LB is transmitted to the output circuit 16 and the read-out data finally appears on the memory circuit output OUT so that the reading operation is completed.

As the signal OS2 assumes the "L" level at a moment $T_{3a}$, the sense amplifier 14 stays no more in the active condition. Therefore, no DC current flows into the sense amplifier 14 after the moment $T_{3a}$, contributing the saving the consumption of electric power.

After the moment $T_{3a}$, on the other hand, the sense amplifier output RB assumes an indefinite level since the sense amplifier is no more in the active condition. Since the signal OS3 assumes the "L" level, however, the latch circuit 15 continues to hold the read-out data.

The sense amplifier 14 is composed of P-channel MOS transistors $Q_7$ and $Q_8$ serving as load elements, and $Q_9$ for equalization of a pair of output nodes, N-channel MOS transistors $Q_{10}$, $Q_{11}$ serving as differential input transistors, and $Q_{12}$ as a current source for enabling the amplifier 14. The transistor $Q_9$ is made conductive in response to "L" (low) level of the signal OS1 to set the sense amplifier in a reset, equalized state. The transistor $Q_{12}$ is made conductive in response to "H" (high) level of the signal OS2 thereby to enable the sense amplifier 14. The latch circuit 15 includes inverters IV2 and IV3 forming a known flip-flop, IV5 serving as an output inverter, and a CMOS transfer gate made of an N-channel MOS transistor $Q_{13}$ and a P-channel MOS transistor $Q_{14}$ for writing the sense amplifier output RB to the flip-flop (IV2, IV3) in response to "H" level of a control signal OS3 which is generated from an output an inverter IV4 whose input is connected to an output of a NAND gate AG1 receiving the signals OS1 and OS2.

Figure 2:
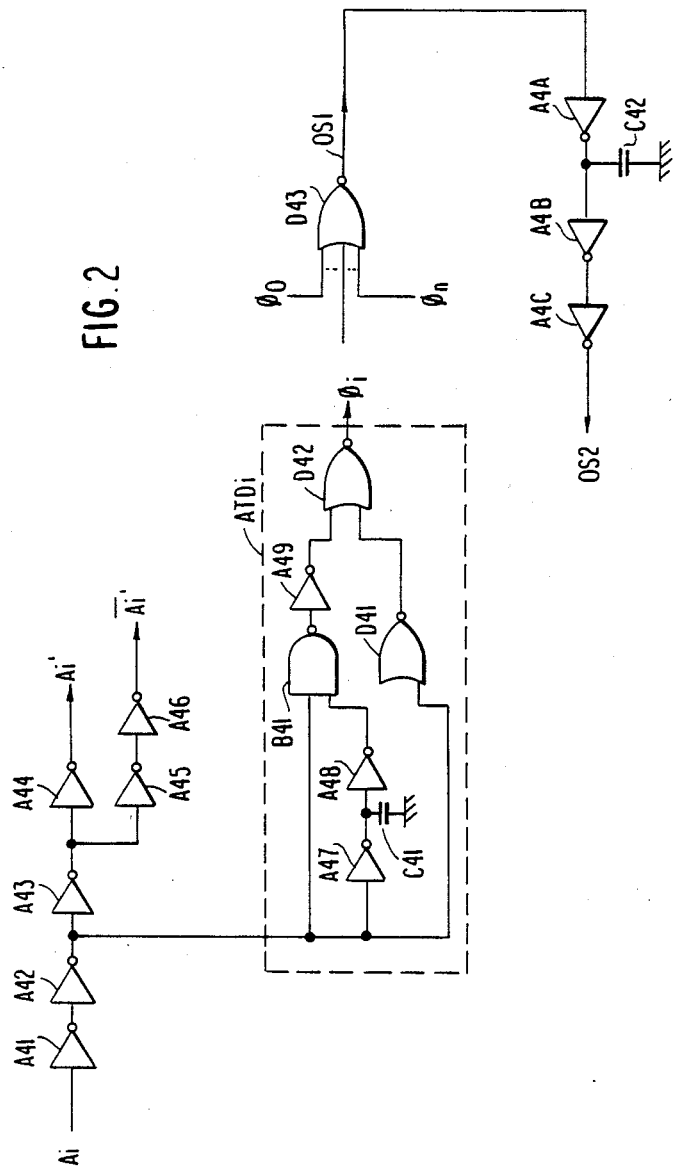
FIG. 2 is a schematic block diagram of the timing signal generator.

An example of the control signal generator 17 is shown in FIG. 2.

An address change detect circuit $ATD_i$ receives a buffered address signal of an address input signal $A_i$ via inverter circuits $A_{41}$ and $A_{42}$ and includes inverter circuits $A_{47}$ and $A_{47}$ constitute a delay circuit with a capacitor $C_{41}$, a NAND circuit $B_{41}$, a NOR circuit $D_{41}$, an inverter $A_{49}$ and a NOR circuit $D_{42}$. Inverters $A_{43}$ and $A_{46}$ are for generating true and complementary internal address signals $A_i'$ and $\overline{A_i'}$ of the address input signal $A_i$. The internal address signals $A_i'$ and $\overline{A_i'}$ are usually applied to the address decoders such as those 11 and 12 in a known way.

When the address signal $A_i$ changes from the "L" level to the "H" level or from the "H" level to the "L" level, the address change detect circuit $ATD_i$ produces an upwardly directed output $\phi_i$ of a pulse width defined by the delay time of the delay circuit made by the inverter circuits $A_{47}$, $A_{48}$ and by the capacitor $C_{41}$.

The output $\phi_i$ of the address change detect circuit is sent to one of the input terminals of a NOR circuit $D_{43}$ which receives outputs $\phi_0-\phi_{i+1}$, $\phi_{i+1}-\phi_n$ of other address change detection circuits (not shown) of other address input signals $A_0-A_n$.

When at least one address input signal such as $A_i$ is charged and the address change detect circuit $ATD_i$ generates the "H" level (up-going) output $\phi_i$, the NOR circuit $D_{43}$ generates the "L" level (downwardly going) the first (one-shot) control signal OS1.

The first control signal OS1 is applied to an input of an inverter circuit $A_{4A}$ whose output is applied to cascaded-connected inverters $A_{4B}$ and $A_{4C}$. The inverters $A_{4A}-A_{4C}$ form a pulse-width change circuit for generating the second control signal OS2. The pulse-width change circuit ($A_{4A}-A_{4C}$) makes the second control signal OS2 at the "H" (high) level after a first delay time from the change of OS1 to the "L" level from the "H" level and makes the second control signal OS2 at the "L" level after a second delay time longer than the first delay time from the time point when the first control signal OS1 is changed to the "H" level from the "L" level.

The inverter circuit $A_{4A}$ produces a large current capacity when the output changes from the "H" level to the "L" and sets a small current capacity when the output changes from the "L" level to the "H" level. That is, when the signal OS1 rises, the moment at which the signal OS2 breaks is determined by a delay time determined by capacity $C_{42}$ that is connected to the inverter circuit $A_{4A}$.

The signal OS1 is used as a control signal for precharging and equalizing the bit lines and data bus lines before the reading operation is started, as mentioned above. That is, it is urged to obtain a one-shot signal having a narrower pulse width to obtain a higher operation speed. The signal OS2, on the other hand, is used for determining a period for selecting the word line and for determining a period for activating the sense amplifier. Therefore, the pulse signal have a width longer than a period in which the read-out data is transmitted to the latch circuit.

Now the problem solved by the present invention will be described.

One of the nuisances involved in using the memory circuit is changed in the power source voltage Vcc and in the ground potential GND accompanying a change in the operation current in the memory circuit. Particularly, the output transistor usually charges and discharges a capacity of from several tens to several hundreds of picofarads, and is generally designed to exhibit a large transistor ability. Therefore, the switching current of the output transistor at the time of reading operation causes the power source voltage Vcc and ground potential GND to change most greatly among other circuit operations.

The input stage of address buffer receiving the address signals may sense a change in the power supply voltage Vcc and in the ground potential GND caused by this change as the change in the input potential, so that the address buffer starts to operate. That is, the potential change is added to the input threshold voltage of the address buffer, and the input level loses its actual significance which is detrimental to the characteristics. Moreover, a great change in the potential makes it difficult to satisfy the specifications of the input level. When the power source voltage Vcc and ground potential GND are changed due to charge and discharge of the output load, that change in the voltage Vcc and voltage GND is sensed by the address buffer as a change in the input potential. Therefore, the signal generator 17 operates and the signal OS1 becomes low during a period of $T_{23}$–$T_{24}$, as shown in FIG. 3B. Then, the data bus lines DB and $\overline{DB}$ are precharged and the pair of input nodes of the sense amplifier 14 are equalized, and the sense amplifier output RB assumes an indefinite level. If the signal OS2 is applied as conventional to the latch circuit 15, the sense amplifier 14 and the latch circuit 15 would be both enabled by the "H" level of OS2 and the sense amplifier output RB of an indefinite level would be transmitted to the output circuit 16 via latch circuit 15 causing the latch output LB to be indefinite and the output OUT to be finally disturbed as indicated by the dotted lines in FIG. 3B.

Figure 4:
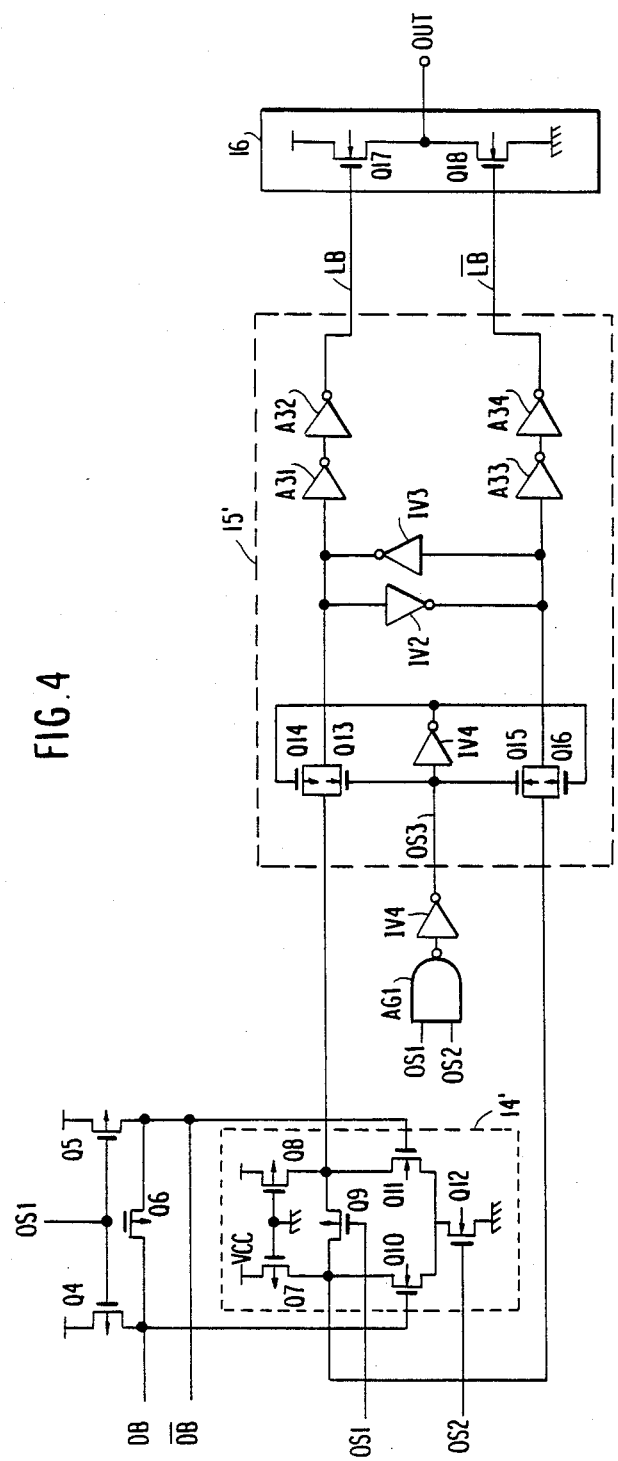
FIG. 4 is a schematic block diagram of the memory circuit according to a second embodiment of the present invention.

According to the invention, the signal OS3 rather than OS2 is applied to the latch circuit 15. At a time point $T_{23}$ (FIG. 3B), the output circuit 15 starts to generate a new state of the output OUT, which is opposite to the previous output state. In this instance, there is caused a relatively large DC current in the output circuit 16. This large DC current affects the value of the power voltage Vcc or the ground voltage applied at least to the inverters $A_{41}$ and $A_{42}$ receiving the address input signal $A_i$ and the comparative relation between the level of the address input signal $A_i$ and the logic threshold of the inverters $A_{41}$, $A_{42}$ is changed. As a result, the address change detection circuit $ATD_i$ considers the change in $V_{cc}$ or ground voltage as the change in the address input signal itself to generate the "H" level of the signal $\phi_i$ and the "L" level of the first control signal OS1 is resultantly generated. Therefore, the pair of bit lines and the pair of data bus lines are again subjected to the precharge operation and to be equalized in level. However, in this instance the control signal OS3 is made "L" level and therefore the transfer gate ($Q_{13}$, $Q_{14}$) in the latch circuit 15 is disenabled and the above precharged states of the pair of bit lines and the pair of bus lines are not transmitted to the flip-flop (IV2, IV3) in the latch circuit 15. Therefore, the latch circuit output LB remains unchanged and the output circuit 15 continues to generate the same level of output OUT, as indicated in the solid lines in FIG. 3B. Then, at a time point $T_{24}$, the control signal OS1 is returned to the "H" level and the control signal OS3 is returned to the "H" level so that the gate circuit ($Q_{13}$, $Q_{14}$) is enabled again. The same level of the sense amplifier output RB is again produced and is written into the latch circuit 15, causing no change in the state of the latch circuit 15 so that the output circuit 16 develops the output of the new logic state. At a time point $T_{25}$, the control signals OS2 and OS3 are returned to the "L" level so that the sense amplifier 14 and the latch circuit 15 are disenabled while the output circuit 16 continues to produce the output OUT. Thus, the sense amplifier output RB of an indefinite level is not written inot the latch circuit 15 upon the change in the state of the output circuit 16, and the states of the latch circuit 15 and the output circuit 16 are not disturbed. With reference to FIG. 4, the major part of the memory circuit according to a second embodiment of the present invention will be explained.

In FIG. 4, the portions or elements corresponding to those in FIG. 1 are denoted by the same references. This embodiment is featured in that true and complementary output signals RB and $\overline{RB}$ are derived from the sense amplifier 14' and an additional gate circuit composed of an N-channel transistor $Q_{15}$ and a P-channel transistor $Q_{16}$ is provided in the latch circuit 15' for transferring the complementary sense amplifier output signal $\overline{RB}$ to the flip-flop composed of the inverters IV2 and IV3. Inverters $A_{31}$ and $A_{32}$ and the inverters $A_{33}$ and $A_{34}$ are also provided in 15', which serve as buffers for producing the true and complementary latch output signals LB and $\overline{LB}$. The output signals LB and $\overline{LB}$ are applied to gates of N-channel push-pull transistors $Q_{17}$ and $Q_{18}$ in the output circuit 16. The fundamental structure of the second embodiment is the same as that of the first embodiment.

It will therefore be obvious that the reading operation is properly carried out. The signal OS3 assumes the "L" level even when the signal OS1 is generated due to change in the power source voltage Vcc and in the ground potential GND and even when an indefinite data appears on the sense amplifier outputs RB and $\overline{RB}$. Therefore, there develops no change in the data held by the inverter circuits $A_{31}$ and $A_{32}$ that latch the read-out data, and the output waveform is not disturbed.

Owing to the employment of the aforementioned structure according to the present invention, the output waveform is not disturbed even when the address change detect circuit is operated due to the change in the power source voltage Vcc and in the ground potential GND being caused by the switching current of the output transistor. Accordingly, the intput level of the address does not lose its actual power.

Moreover, the current capacity can be increased without the need of giving attention to the current capacity of the output transistor or the change of potential difference in the power source voltage Vcc and in the ground potential GND, thus making it possible to increase the reading speed.

I claim:

1. A memory circuit comprising a memory cell array having a plurality of memory cells arranged in a matrix form of rows and columns, row lines arranged in rows and column lines arranged in columns, precharge means coupled to said column lines for operatively precharging said column lines thereby setting said column lines at a predetermined potential, means for receiving address input signals, a sense amplifier having an input end and an output end, a selection circuit connected between said column lines and the input end of said sense amplifier for selectively transferring a signal at one end of said column lines to the input end of said sense amplifier in accordance with said address input signals, a latch circuit having an input end and an output end for holding a signal at the input end thereof, a transfer circuit connected between the output end of said sense amplifier and the input end of said latch circuit for operatively providing a signal path therebetween, an output circuit having an input end coupled to the output end of said latch circuit for generating an output signal, a control signal generator coupled to said receiving means for generating first and second control signals when the level of at least one of said address input signals is changed, said second control signal being generated after the generation of said first control signal and terminated after the termination of said first control signal, first control means for enabling said precharge means in response to said first control signal, a second control means for enabling said sense amplifier in response to said second control signal, and a third control means for enabling said transfer circuit only when said second control signal is present and said first control signal is not present, whereby said memory cell array is first laid in a reset state in response to said first control signal in which said column lines are precharged and then laid in an enabled state in which read out signals from the memory cells are generated on said column lines after the termination of said first control signal under the presence of said second control signal.

2. The memory circuit according to claim 1, further comprising a fourth control means for resetting said sense amplifier in response to said first control signal.

3. The memory circuit according to claim 1, in which said transfer circuit includes a first field effect transistor of P-channel type and a second field effect transistor of N-channel type connected in parallel.

4. The memory circuit according to claim 1, in which said selection circuit includes a plurality of selection field effect transistors connected between said column lines and the input end of said sense amplifier, respectively.

5. A memory circuit comprising a memory cell array having a plurality of word lines arranged in rows, a plurality of pairs of digit lines arranged in columns normal to said rows, and a plurality of memory cells coupled to said word lines and said digit lines, first means for receiving row address signals, second means for receiving column address signals, a row selection circuit coupled to said memory cell array for operatively selecting one of said word lines, a pair of data lines, a column selection circuit coupled between said plurality of pairs of digit lines and said pair of data lines for operatively transferring signals at a selected pair of digit lines to said pair of data lines, a first precharge circuit coupled to said plurality of pairs of digit lines for operatively precharging said plurality of pairs of digit lines to a first determined potential, a second precharge circuit coupled to said pair of data lines for operatively precharging said pair of data lines to a second predetermined potential, a sense amplifier having a pair of input ends and an output end, a latch circuit having an input end and an output end, a transfer circuit connected between the output end of said sense amplifier and the input end of said latch circuit for operatively transferring a signal at the output end of said sense amplifier to the output end of said latch circuit, an output circuit having an input end coupled to the output end of said latch circuit for generating an output signal, a control signal generation circuit coupled to said first and second means for generating first and second control signals in response to a level change in at least one of said row and column address signals, said first control signal assuming its active level only for a first time duration substantially from a first time point when at least one of said row and column address signals is changed to level, said second control signal assuming its active level only for a second time duration from a second time point which is after said first time point by a third time duration, said second time duration being longer than said first time duration, a first control means coupled to said first and second precharge means for enabling said first and second precharge circuits in response to the active level of said first control signal thereby to precharge said plurality of pairs of digit lines and said pair of data lines during said first time duration, a second control means coupled to said control signal generation circuit for enabling said row selection circuit, said column selection circuit and said sense amplifier in response to the active level of said second control signal so that a selection of the memory cells is performed by said row selection circuit and said column selection circuit and a read signal from the selected memory cell is amplified by said sense amplifier during said second time duration, and a third control means coupled to said control signal generation circuit for enabling said transfer circuit thereby to determine a state of said latch circuit only when said second control signal assumes the active level and said first control signal assumes its inactive level.

6. The memory circuit according to claim 5, in which tha active level of said first control signal is a low level and the active level of said second control signal is a high level, and said control means includes a NAND gate receiving said first and second control signals.

7. The memory circuit according to calim 5, in which each of said memory cells is a static type memory cell.

* * * * *

UNITED STATES PATENT AND TRADEMARK OFFICE
CERTIFICATE OF CORRECTION

PATENT NO. : 4,894,803

DATED : January 16, 1990

INVENTOR(S) : Shingo AIZAKI

It is certified that error appears in the above-identified patent and that said Letters Patent is hereby corrected as shown below:

Col. 1, line 15, delete "generater" and insert --generator--;

Col. 2, line 21, delete "multifunction" and insert --malfunction--;

Col. 2, line 41, delete "atatic" and insert --static--;

Col. 3, line 27, delete "but" and insert --bus--;

Col. 4, line 6, after "and $A_{47}$" insert --which--;

Col. 5, line 38, delete "-$T_{23}$" and insert --$T_{23}$--;

Col. 6, line 8, delete "inot" and insert --into--;

Col. 6, line 47, delete "intput" and insert --input--;

Col. 8, line 46, delete "tha" and insert --the--;

UNITED STATES PATENT AND TRADEMARK OFFICE
CERTIFICATE OF CORRECTION

PATENT NO. : 4,894,803

DATED : January 16, 1990

INVENTOR(S) : Shingo Aizaki

It is certified that error appears in the above-identified patent and that said Letters Patent is hereby corrected as shown below:

Col. 8, line 48, after "said" insert --third--.

Signed and Sealed this

Twelfth Day of February, 1991

*Attest:*

HARRY F. MANBECK, JR.

*Attesting Officer*      *Commissioner of Patents and Trademarks*